United States Patent
Sanders

(10) Patent No.: US 7,245,191 B2
(45) Date of Patent: Jul. 17, 2007

(54) PLL CIRCUIT WITH SELF-SELECTING VARIABLE DIVIDE RATIO

(75) Inventor: Jeffrey Sanders, Thousand Oaks, CA (US)

(73) Assignee: Inphi Corporation, Westlake Village, CA (US)

( * ) Notice: Subject to any disclaimer, the term of this patent is extended or adjusted under 35 U.S.C. 154(b) by 90 days.

(21) Appl. No.: 11/217,183

(22) Filed: Sep. 1, 2005

(65) Prior Publication Data

US 2007/0046388 A1    Mar. 1, 2007

(51) Int. Cl.
*H03B 5/12* (2006.01)
*H03L 7/00* (2006.01)

(52) U.S. Cl. ............ 331/179; 331/16; 331/17; 331/34; 331/44

(58) Field of Classification Search ........... 331/16, 331/179
See application file for complete search history.

(56) References Cited

U.S. PATENT DOCUMENTS 6,806,786 B1 * 10/2004 Lam et al. ............ 331/179

2005/0116781 A1 * 6/2005 Yamamoto et al. ............ 331/2
2005/0237119 A1 * 10/2005 Irie ............ 331/16

* cited by examiner

*Primary Examiner*—Joseph Chang
(74) *Attorney, Agent, or Firm*—Koppel, Patrick, Heybl & Dawson

(57) ABSTRACT

A PLL circuit provides a self-selecting divide ratio, which is varied as necessary to lock the circuit to a reference clock which may have several possible frequencies, thereby enabling the VCO to employ a type of oscillator having a superior jitter characteristic. The PLL circuit includes a variable divider which divides the VCO output by a divide ratio value provided by a frequency band select circuit, which provides the divide ratio needed to drive the phase difference between the reference and divided clocks toward zero while the VCO clock output operates within a predetermined frequency range. The self-selecting variable divide ratio allows the VCO's oscillator to have a narrow output frequency range, thereby allowing the use of an oscillator type with a jitter characteristic which may be low enough to meet the requirements of JEDEC, for example.

11 Claims, 4 Drawing Sheets

PLL CIRCUIT WITH SELF-SELECTING VARIABLE DIVIDE RATIO

BACKGROUND OF THE INVENTION

1. Field of the Invention

This invention relates to the field of phase-locked loop (PLL) circuits, and particularly to PLL circuits used to distribute multiple clock signals.

2. Description of the Related Art

Most digital electronic circuits operate in response to a clock signal. In some applications, a number of different integrated circuits (ICs) each require their own clock signal, with all the clock signals derived from and in phase with a reference clock.

One method of accomplishing this is with the use of a phase-locked loop (PLL) circuit, which receives a reference clock and produces an output signal which is in-phase with the reference clock. A conventional PLL circuit is shown in FIG. 1. Here, a reference clock 10 having a frequency $f_{ref}$ is applied to one input of a phase detector 11, which also receives a second input 12. The phase detector produces an output 14 which varies with the phase difference between its two input signals. Output 14 is provided to a loop filter 16, the output of which is applied to the control input 18 of a voltage-controlled oscillator (VCO) 20. The VCO produces an output 22 having a frequency $f_{VCO}$ which is applied to the input of a divide-by-N circuit 24. The output 26 of divider 24 has a frequency $f_{div}$, and is fed back to input 12 of phase detector 10.

In operation, N is typically a fixed integer. The frequency $f_{VCO}$ is N times higher than $f_{ref}$, and is divided down to $f_{ref}$ by divider 24. When the loop is "locked", the voltage applied by loop filter 16 to VCO input 18 drives the phase difference between phase detector input signals 10 and 12 to zero, such that output 26—CLK OUT—has a frequency $f_{div}$ which is equal to $f_{ref}$, and which is in phase with $f_{ref}$.

VCO 20 is conventionally made from a ring oscillator, as illustrated in FIG. 1. Ring oscillators have a wide output frequency range; as such, they are well-suited for use in PLL circuits which lock to a reference clock that can have several different frequencies. For example, the frequency $f_{ref}$ of reference clock 10 might switch between frequencies of 100 MHz, 200 MHz, and 400 MHz. If N is a fixed integer, the VCO output needs to have a wide frequency range if the PLL is to be capable of locking onto each of these reference clocks.

One drawback to the use of a ring oscillator-based VCO is its relatively high jitter specification. In some applications, clock jitter is required to be less than a particular value. For example, for a particular type of DRAM known as DDR DRAM, the Joint Electron Device Engineering Council (JEDEC) has established limits for certain parameters associated with DDR DRAM—including the amount of jitter which may be present in the clock signals fed to the DDR DRAM chips. The clock signals generated with some PLL circuits, such as ones employing a ring oscillator-based VCO, may exceed the JEDEC specification.

SUMMARY OF THE INVENTION

A PLL circuit is presented which overcomes the problems noted above, providing clock signals with low jitter while being able to accommodate multiple reference clock frequencies.

The present PLL circuit provides a self-selecting divide ratio, which is varied as necessary to lock the circuit to a reference clock—referred to herein as RefClk—which may have several possible frequencies. In addition, because the divide ratio is variable and self-selecting, the circuit's VCO may employ a type of oscillator—such as an L-C tank oscillator—having a superior jitter characteristic, but narrower tuning range.

The invention comprises a PLL that includes a VCO having a predetermined output clock frequency range, a phase detector, and a loop filter. The PLL circuit's divider is a variable divider having an divide ratio control input, which divides the VCO output by a value that varies with a signal applied to the divide ratio control input; the divider output is a clock signal referred to herein as DivClk. The PLL circuit includes a "band select" circuit which receives RefClk and DivClk as inputs, and provides the divide ratio control signal needed to drive the phase difference between RefClk and DivClk toward zero while the VCO clock output operates within its predetermined frequency range. Once the PLL is locked, the divide ratio remains fixed as long as RefClk remains within a predefined range.

The self-selecting variable divide ratio allows the VCO's oscillator to have a narrow output frequency range, thereby allowing the use of an oscillator type with a jitter characteristic which may be low enough to meet the requirements of JEDEC, for example.

Further features and advantages of the invention will be apparent to those skilled in the art from the following detailed description, taken together with the accompanying drawings.

DETAILED DESCRIPTION OF THE INVENTION

Figure 1:
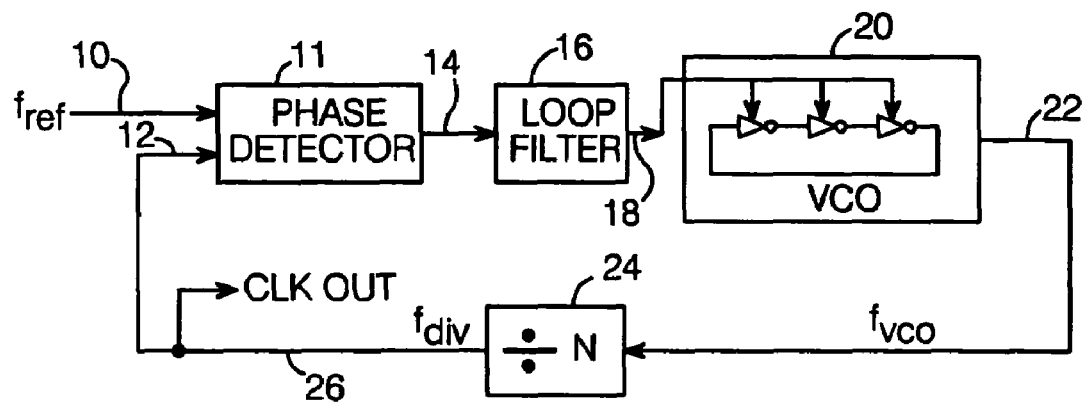
FIG. 1 is a block diagram of a known PLL circuit.
Figure 2:
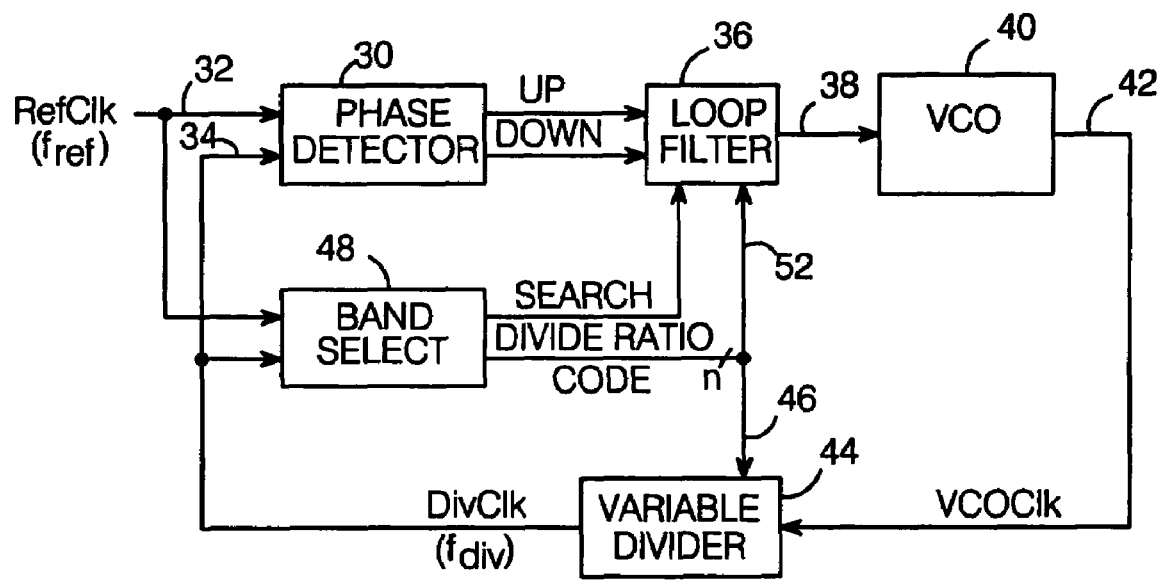
FIG. 2 is a block diagram of a PLL circuit in accordance with the present invention.

A PLL circuit in accordance with the present invention, which includes a self-selecting variable divide ratio, is shown in FIG. 2. The circuit includes a phase detector 30 which receives a reference clock 32 (RefClk) having a frequency $f_{ref}$ at a first input, and a feedback clock signal 34 (DivClk) at a second input, and which produces an output that varies with the phase difference between the two inputs. A loop filter 36 receives the phase detector outputs, and produces a control voltage 38 that varies with the phase difference. The control voltage is applied to the control input of a VCO 40, which produces a clock output 42 (VCOClk) having a frequency $f_{VCO}$ that varies with the control voltage. VCO output 42 is provided to a variable divider 44, which is arranged to divide down VCOClk by an integer value that varies with a digital divide ratio code value applied to the divider's divide ratio control input 46. The output of divider 44 (DivClk) has a frequency $f_{div}$, and is the feedback clock signal applied to input 34 of phase detector 30.

The PLL circuit also includes a band select circuit 48. Controller 48 receives RefClk and DivClk at respective inputs, and produces the n-bit divide ratio code value applied to divide ratio control input 46. Band select circuit 48 is arranged to set the divide ratio as necessary to enable the PLL circuit to lock onto reference clock 32 with VCO 40 operating within its output frequency range. Once the PLL is locked, the divide ratio remains fixed as long as RefClk remains within a predefined range.

The tuning range of the PLL for a given divide ratio defines a particular frequency band. For example, if divider 44 can output 16 different divide ratios, then there are 16 different frequency bands the PLL can settle into. The frequency bands overlap at their edges, which ensures continuous coverage of the possible RefClk frequencies. If RefClk lies within the overlap of two bands, the present circuit is arranged to select the "optimal" band, defined as the band having a center frequency closest to RefClk. For this reason, the circuit searches for the divide ratio corresponding to the optimal frequency band with the VCO set to its center frequency (discussed in more detail below).

In some instances, best performance may be obtained if the loop filter's operation is made to vary with the selected divide ratio. In this case, loop filter 36 also receives the divide ratio code value as an input, and is arranged to vary its operation in response. For example, when the loop filter implementation includes a charge pump, PLL bandwidth is proportional to charge pump current and inversely proportional to divide ratio. The divide ratio code could be provided to the charge pump to make its pump current vary inversely with the divide ratio. This makes bandwidth constant across frequency bands, which is desirable in almost every application, including JEDEC.

Loop filter 36 also receives a "SEARCH" signal from band select circuit 48. The band select circuit performs a "band search", which searches for and finds the proper divide ratio, when specific conditions are detected. When a band search is commenced, a SEARCH signal is provided to loop filter 36, which is arranged to respond by outputting a control voltage to VCO 40 needed to set the VCO to its center frequency. The band search process is discussed in detail below.

VCO 40 is preferably implemented with an L-C tank oscillator. An L-C tank oscillator is preferred because it offers a jitter characteristic that is better than that provided by other oscillator types, such as a ring oscillator. In some case, the improved jitter characteristic enables the PLL circuit to meet a maximum jitter specification that might not be met otherwise. Though L-C tank oscillators have superior jitter characteristics, they also tend to have relatively narrow output frequency ranges—typically about ±15% around a center frequency. If used in a PLL circuit having a fixed divide ratio, the L-C tank oscillator's limited output frequency range limits the range of reference clock frequencies to which the circuit can be locked.

The invention overcomes this problem with the use of a self-selecting variable divide ratio. As noted above, band select circuit 48 generates a divide ratio code value that varies with the magnitude of the phase difference between RefClk (32) and DivClk (34), with the selected divide ratio enabling the PLL circuit to lock onto reference clock 32 while VCO 40 operates within its output frequency range.

This arrangement may also help enable the PLL circuit to meet other system requirements. For example, the PLL circuit may need to meet a bandwidth or open loop gain requirement—as specified by JEDEC, for example. Loop filter 36 may be implemented such that the PLL circuit's open loop gain and bandwidth are proportional to 1/N (where N is the selected divide ratio). By varying N with phase difference as described herein, it may be possible to have the PLL circuit meet a particular loop gain specification which might otherwise be unattainable—regardless of the value of divide ratio N.

Note that this invention is not limited to the configuration illustrated in FIG. 2. For example, the invention might be implemented such that the divide ratio code value is conveyed using an analog control signal (with divider 44 being correspondingly arranged to vary its divide ratio with the analog control signal). Note that, when the PLL circuit is arranged such that divide ratio controller 48 generates a digital divide ratio code value, the value preferably increments and decrements in accordance with a graycode, to minimize switching glitches that might otherwise occur in divider 44.

Phase detector 30 and loop filter 36 may be implemented in accordance with methods well-known to those familiar with the art; typical implementations are described, for example, in D. Wolaver, *Phase-Locked Loop Circuit Design*, Prentice Hall (1991), Ch. 3-4.

Figure 3A:
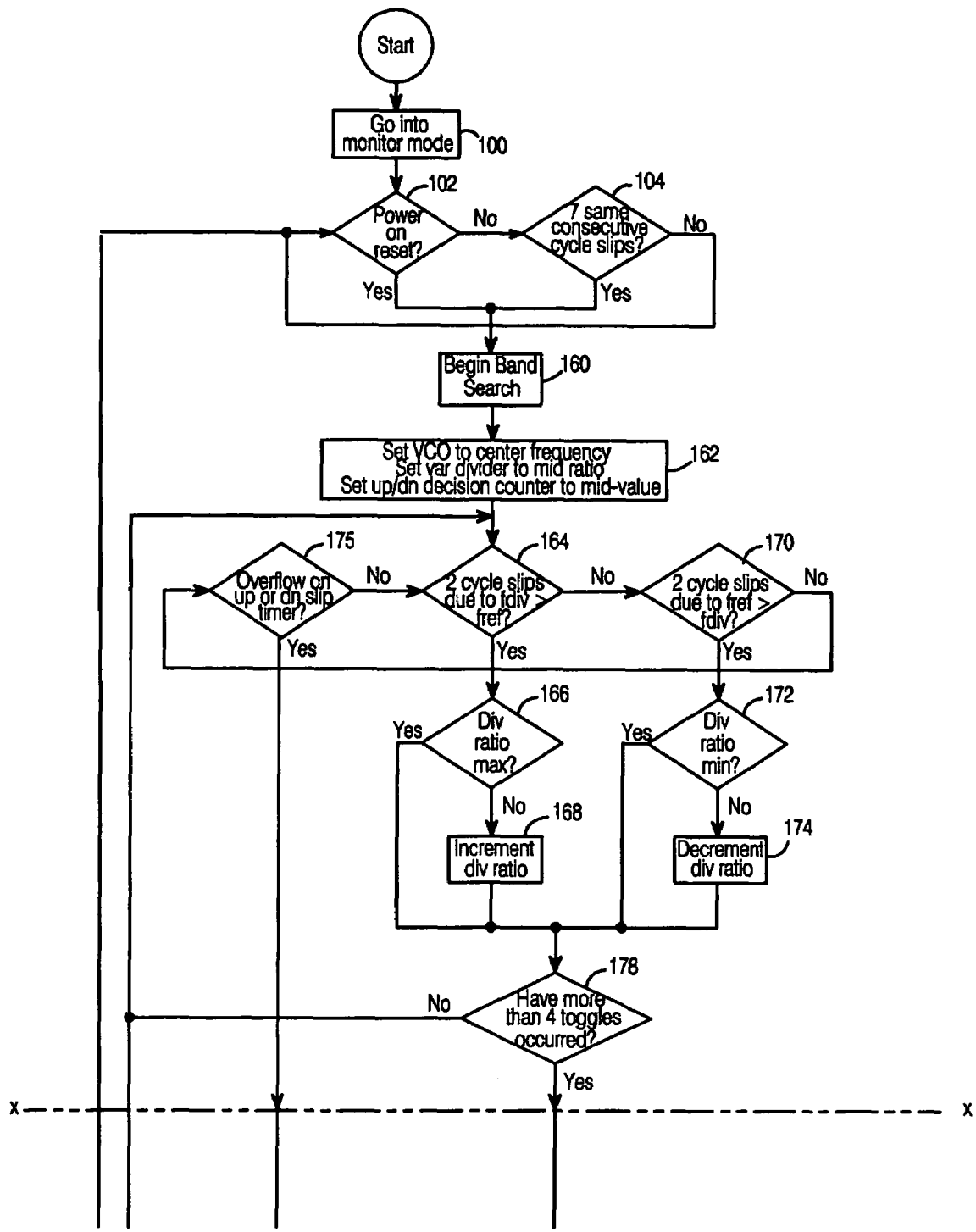
FIG. 3 is a flow chart illustrating a process sequence as might be executed by the present invention's band select circuit.
Figure 3B:
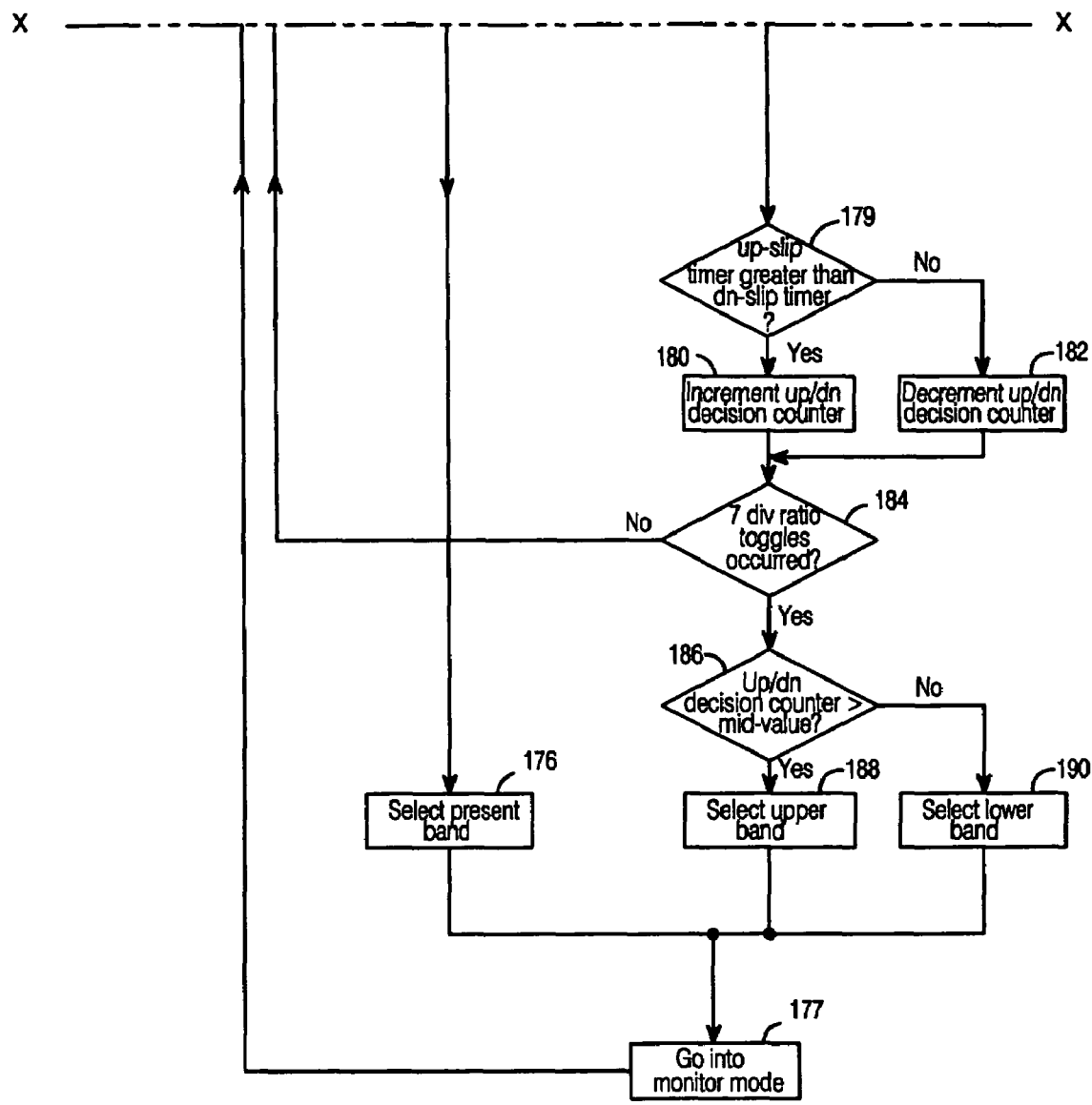

One possible band search process sequence that might be executed by band select circuit 48 is illustrated in the flow chart shown in FIG. 3. The process sequence may be in one of two basic modes: a "monitor" mode and a "band search" mode. When band select circuit 48 is not actively searching for the appropriate divide ratio (which results in the DivClk operating in a particular frequency band), it is in "monitor" mode, and vice versa. The process starts in monitor mode (100). Band search mode can be triggered by either of two events: 1) if a "power-on reset" is being performed as a result of powering up the PLL circuit (102), or 2) if a predetermined number (7 in this example) of consecutive "cycle slips" have been detected (104).

A "cycle slip" is defined as follows: consider the phase between RefClk and DivClk as being defined as the time difference from the rising edge of RefClk to the rising edge of DivClk. If this phase is plotted versus time, it looks like a stepwise function with a period $f_{ref}-f_{div}$. A "cycle slip" is defined as the time that this function passes through zero. As used herein, an "up-slip" occurs each time the function passes through zero due to $f_{div}>f_{ref}$, and a "down-slip" occurs each time the function passes through zero due to $f_{div}<f_{ref}$. Detecting the predetermined number of consecutive cycle slips indicates a frequency difference between RefClk and DivClk that may exceed the PLL circuit's ability to eliminate with the VCO staying within its output frequency range. In this case, using a different divide ratio may enable the VCO to stay within its output frequency range; therefore, a band search process is commenced (106).

The first step (162) in the band search process is to set VCO 40 to its center frequency, set the divide ratio employed by variable divider 44 to mid-ratio, and set an up/down decision counter to mid-value. The VCO is set to its center frequency by, for example, commanding loop filter 36 to output a control voltage which corresponds to the VCO's center frequency; this is accomplished using the SEARCH signal from band select circuit 48. As band select circuit 48 provides the divide ratio code value to the variable divider's divide ratio control input 46, circuit 48 sets the variable divider 44 to mid-ratio directly. An up/down decision counter is used near the end of the process, to select an optimum divide ratio from between two adjacent ratios; it will be discussed in more detail below.

With the VCO, divider, and up/down decision counter initialized, band select circuit 48 monitors for cycle slips. If two consecutive up-slips are detected (164), indicating that $f_{div}>f_{ref}$, and the divide ratio has not reached an upper limit (166), the divide ratio is incremented by one (168). If two consecutive down-slips are detected (170), indicating that $f_{div}<f_{ref}$, and the divide ratio has not reached a lower limit (172), the divide ratio is decremented by one (174).

"Up-slips" and "down-slips" are suitably monitored on respective "up-slip" and "down-slip" timers, which track the amount of time that passes between consecutive up-slips or down-slips, respectively. The timers are arranged to overflow if a predetermined amount of time passes without a subsequent cycle slip, which indicates that the present divide ratio is providing an $f_{div}$ that is very close to $f_{ref}$. If neither two consecutive up-slips or down-slips have been detected, the up-slip and down-slip timers are tested to see if they have overflowed (175). If so, the frequency band represented by the current divide ratio is selected (176), and the process reverts to monitor mode (177).

If the divide ratio has been incremented or decremented, or if the divide ratio has reached its upper or lower limits, band select circuit 48 monitors for "toggles" (178). A "toggle" occurs when the band search process sequence is toggling between two adjacent divide ratios, so that $f_{div}$ toggles above (up) and below (down) $f_{ref}$. If less than a predetermined number of toggles have occurred (4 in this example), the process sequence returns to step 164 such that the divide ratio can be incremented or decremented as needed.

However, if more than the predetermined number of toggles have occurred, indicating that the proper divide ratio is one of the two adjacent ratios between which the band select circuit is toggling, the values in the up-slip and down-slip timers are compared (step 179). If the up-slip timer value is greater than the down-slip timer value, the up/down decision counter is incremented (step 180). Otherwise, the up/down decision counter is decremented (step 182).

If less than a predetermined number of toggles have occurred (7 in this example) (184), control returns to step 164 such that the divide ratio can again be incremented or decremented as needed. If, however, more than the predetermined number of toggles have occurred, the up/down decision counter is tested to see if its value is greater than or less than the mid-value it was set to initially (186). If the up/down decision counter's value is greater than the mid-value, indicating that $f_{div}$ is spending more time at the higher of the two frequencies between which it is toggling, the divide ratio which provides the higher frequency is selected (188). However, if the up/down decision counter's value is less than the mid-value, indicating that $f_{div}$ is spending more time at the lower of the two frequencies between which it is toggling, the divide ratio which provides the lower frequency is selected (190). The band select circuit then reverts to monitor mode 192.

Figure 4:
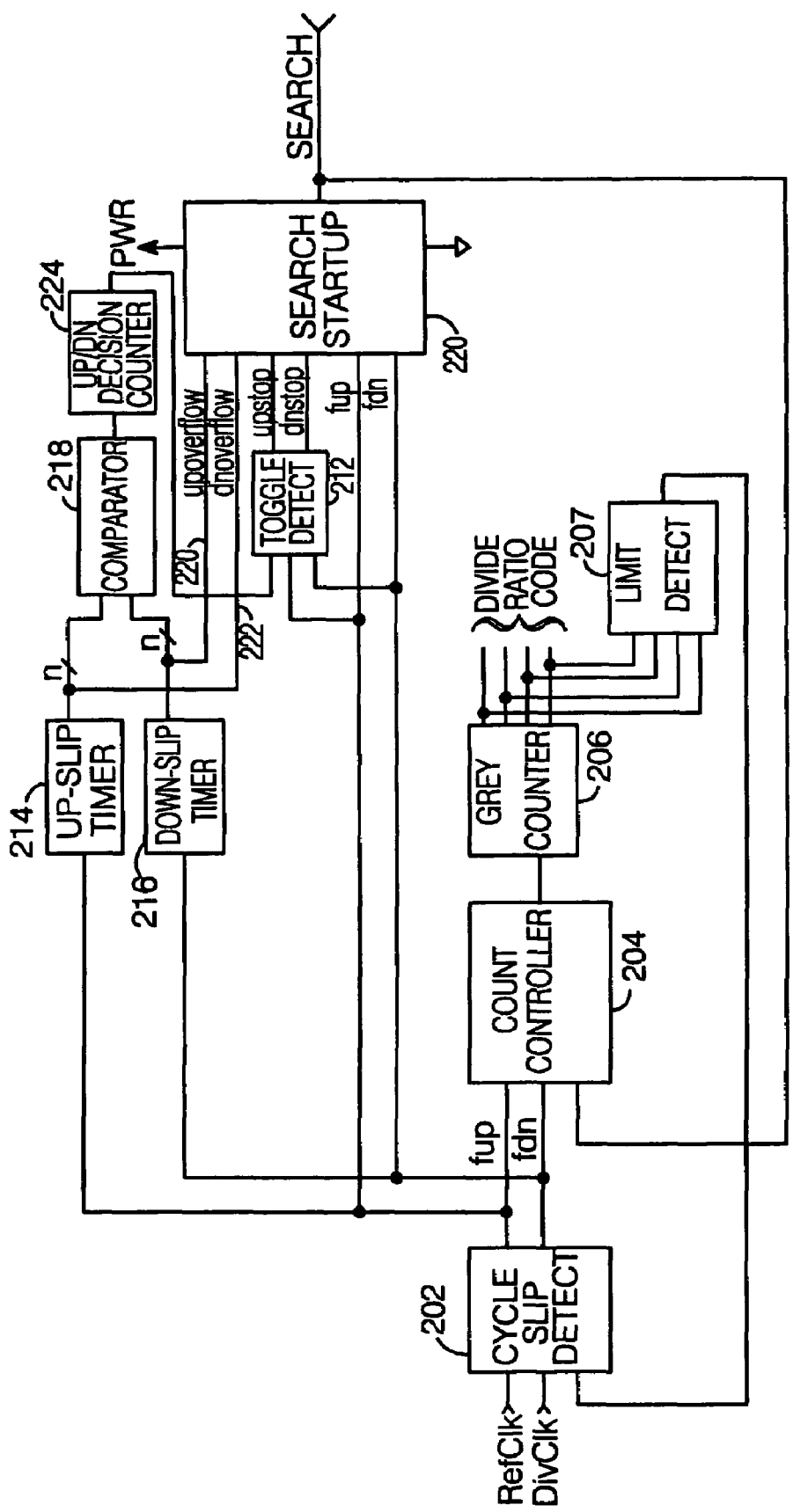
FIG. 4 is a block diagram of one possible embodiment of a band select circuit in accordance with the present invention.

One possible implementation of a band select circuit 48 capable of performing the illustrated process sequence is shown in FIG. 4. A "search startup" circuit 200 monitors the system for the conditions which trigger a band search: a power-on reset (102) or the occurrence of a predetermined number of cycle slips (104). When either condition is detected, the SEARCH output of circuit 200 is toggled. A "cycle slip detect" circuit 202 receives RefClk and DivClk, and is arranged to pulse an output "fup" when a cycle slip is detected due to RefClk>DivClk, and to pulse an output "fdn" when a cycle slip is detected due to RefClk<DivClk. Signals fup and fdn are provided to search startup circuit 200, which monitors them to detect the occurrence of a predetermined number of cycle slips.

Signals fup and fdn are also provided to a "count controller" circuit 204, along with the SEARCH signal. When SEARCH is asserted, the count controller forces a counter 206, preferably a grey counter, to mid-ratio. Count controller 204 tests for the two consecutive up-slips or down-slips conditions found in steps 164 and 170, respectively. The output of count controller 204 controls counter 206, which outputs the actual divide ratio code. If two consecutive up-slips are detected, and if the divide ratio code is not at a maximum limit (166), the divide ratio code is incremented (168). If two consecutive down-slips are detected, and if the divide ratio code is not at a minimum limit (172), the divide ratio code is decremented (174).

A "limit detect" circuit 207 monitors the output of counter 206, and detects when too much time is spent in a particular frequency band. This can happen when RefClk is very close to the current band, which causes there to be a long lag between cycle slips. When the lag time is greater than a predetermined minimum, the output of limit detect circuit 207 is toggled. Another situation which causes the limit detect circuit output to toggle occurs when the RefClk frequency is greater than the highest frequency band or lower than the lower band. In this case, the circuit will eventually reach and remain in the top or bottom band. If limit detect circuit 207 detects that the circuit has been in the top or bottom band for a time greater than a predetermined minimum, the limit detect circuit output is toggled. The limit detect circuit output is fed back to cycle slip detect circuit 202, where it acts to inhibit fup and fdn from changing.

Signals fup and fdn are also provided to a toggle detect circuit 212, which detects and counts "toggles" per process steps 178 and 184.

Signals fup and fdn are also provided to an up-slip timer 214 and a down-slip timer 216, which track the amount of time that passes between consecutive up-slips or down-slips, respectively. A comparator 218 receives values representing the up-slip and down-slip times, and determines which is longer (179). This reveals the frequency band which the system is spending the most time in.

Timers 214 and 216 are arranged to overflow after a predetermined amount of time has passed without a subsequent cycle slip, which indicates that the present divide ratio is providing an $f_{div}$ that is very close to $f_{ref}$. The overflow signals 220 and 222 are provided to search startup circuit 200; when asserted, the search is terminated and the present frequency band selected.

An up/down decision counter 224 is incremented (180) when the comparator indicates that the up-slip time is greater than the down-slip time, and is decremented (182) when the down-slip time is greater than the up-slip time. The output of counter 224 is delivered to toggle detect circuit 212. Now, when a predetermined number of toggles are detected (184), toggle detect circuit 212 outputs an "upstop" signal if the up/down decision counter is greater than mid-value (188), or a "dnstop" signal if the up/down decision counter is less than mid-value (190). These signals are provided to search select circuit 200, which terminates the search in response. If "upstop" is asserted, the higher of two adjacent divide ratios is selected; if "dnstop" is asserted, the lower of the two ratios is selected.

With the band search terminates, the SEARCH signal is de-asserted, and the PLL circuit returns to monitor mode (177). Any remaining error between $f_{div}$ and $f_{ref}$ is driven towards zero by the normal operation of the PLL loop.

Many possible circuit implementations could be employed to execute the process sequence illustrated in FIG. 3; the configuration shown in FIG. 4 is merely exemplary. Methods of implementing the circuit blocks shown in FIG. 4 would be well-known to those of ordinary skill in the art.

The cycle slip detect circuit 202, is used to detect both the magnitude and sign of the frequency difference between $f_{ref}$ and $f_{div}$. At its input, $f_{ref}$ and $f_{div}$ are applied to a phase detector, such as circuit 30. The up output of this phase detector along with $f_{ref}$ divided in frequency by 2, is used to generate the fup output of cycle slip detect circuit 202. Similarly, the down output of this phase detector along with $f_{ref}$, further divided in frequency by 2, is used to generate the fdn output of circuit 202. When a cycle slip occurs with $f_{ref} > f_{div}$, the fup output will have a pulse equal in duration to one period of the $f_{ref}$ signal. Similarly, when a cycle slip occurs with $f_{div} > f_{ref}$, the fdn output will have a pulse equal in duration to one period of the $f_{div}$ signal. The frequency of the pulses from either fup of fdn is inversely proportional the difference in frequency between $f_{ref}$ and $f_{div}$.

The toggle detect circuit 212 is used to detect that the band select circuit 48 is alternating between increasing and decreasing the divide ratio during the band select process. This indicates that the two most optimal bands have been found, and the search process should terminate on the most optimal of the two bands. The frequency of $f_{ref}$ will be between the center frequencies of the two bands. The output of the up/down decision circuit 224 determines which of the two bands is optimal, the higher or the lower.

While particular embodiments of the invention have been shown and described, numerous variations and alternate embodiments will occur to those skilled in the art. Accordingly, it is intended that the invention be limited only in terms of the appended claims.

I claim:

1. A phase-locked loop (PLL) circuit with self-selecting variable divide ratio, comprising:
    an L-C tank oscillator having an input and which produces a clock output having a frequency that varies within a predetermined frequency range with a control voltage applied to said input;
    a variable divider having an divide ratio control input and which receives said L-C tank oscillator clock output and divides it by a divide ratio value that varies with a divide ratio control signal applied to said divide ratio control input;
    a phase detector which receives a reference clock and said divided-down L-C tank oscillator clock at respective inputs and produces one or more outputs that vary with the difference in phase between said inputs; and
    a loop filter which receives at least one of said phase detector outputs and provides said control voltage to said L-C tank oscillator input so as to reduce the difference in phase between said reference clock and said divided-down L-C tank oscillator clock; and
    a frequency band select circuit which provides said divide ratio control signal to said variable divider's divide ratio control input such that a divide ratio value is selected which enables said phase difference to be driven toward zero with said L-C tank oscillator clock output within said predetermined frequency range,
    wherein said PLL circuit has a predetermined loop gain specification, said frequency band select circuit arranged to provide said divide ratio control signal such that said PLL circuit's loop gain remains within said predetermined loop gain specification.

2. The PLL circuit of claim 1, wherein said loop gain specification is that specified by JEDEC for DDR RAM.

3. The PLL circuit of claim 1, wherein said loop filter is arranged to receive said divide ratio control signal and to vary said control voltage with said divide ratio control signal.

4. The PLL circuit of claim 3, wherein said loop filter comprises a charge pump, said loop filter arranged such that the current produced by said charge pump varies inversely with said divide ratio control signal such that PLL loop bandwidth is constant for all obtainable divide ratio values.

5. The PLL circuit of claim 1, wherein said loop filter is arranged to, in response to a SEARCH signal, output a control voltage to said L-C tank oscillator such that said L-C tank oscillator's clock output frequency is in the middle of said predetermined frequency range.

6. The PLL circuit of claim 5, wherein said frequency band select circuit is arranged to vary said divide ratio control signal under predetermined conditions, and to provide said SEARCH signal to said loop filter when one or more of said predetermined conditions is detected.

7. The PLL circuit of claim 6, wherein said frequency band select circuit is arranged such that one of said predetermined conditions is the application of power to said PLL circuit.

8. The PLL circuit of claim 6, wherein said band select circuit receives said reference clock and said divided-down L-C tank oscillator clock at respective inputs, said reference clock having a frequency $f_{ref}$ and said divided-down L-C tank oscillator clock having a frequency $f_{div}$, said frequency band select circuit arranged such that one of said predetermined conditions is the detection of a difference between $f_{div}$ and $f_{ref}$ greater than a predetermined minimum value.

9. The PLL circuit of claim 8, wherein said band select circuit is further arranged to output said divide ratio control signal such that said divide ratio value is decreased if $f_{div} < f_{ref}$ and said divide ratio value is increased if $f_{div} > f_{ref}$.

10. The PLL circuit of claim 9, wherein said band select circuit is further arranged to:
    detect when said divide ratio value is toggling between two adjacent values;
    compare the amount of time spent at each of said two adjacent divide ratio values; and
    provide the divide ratio control signal to said variable divider's divide ratio control input needed to select the divide ratio value at which the greater amount of time is spent.

11. A method of setting a divide ratio for a phase-locked loop circuit which includes a voltage controlled oscillator (VCO) that produces an output clock signal (VCOClk), comprising:
    monitoring a reference clock (RefClk) having a frequency $f_{ref}$ and a clock (DivClk) having a frequency $f_{div}$ produced by dividing VCOClk by a divide ratio;
    detecting a "cycle slip", defined as when a plot of the time difference between the rising edge of RefClk and the rising edge of DivClk versus time passes through zero, said cycle slip being an "up-slip" when said plot passes through zero due to $f_{div} > f_{ref}$ and a "down-slip" when said plot passes through zero due to $f_{ref} > f_{div}$;
    setting said divide ratio to a mid-ratio value when the number of detected cycle slips exceeds a predetermined minimum number;
    incrementing said divide ratio when a predetermined number of consecutive up-slips are detected and decrementing said divide ratio when a predetermined number of consecutive down-slips are detected;
    detecting when said divide ratio is being toggled between adjacent values;
    detecting when said divide ratio has toggled between adjacent values a predetermined number of times;
    selecting the higher of the two divide ratios when said divide ratio has toggled between adjacent values said predetermined number of times and the time that between consecutive up-slips is greater than the time between consecutive down-slips; and selecting the lower of the two divide ratios when said divide ratio has toggled between adjacent values said predetermined number of times and the time that between consecutive up-slips is less than the time between consecutive down-slips.

* * * * *